US011135669B2

(12) United States Patent
Stabach et al.

(10) Patent No.: US 11,135,669 B2
(45) Date of Patent: Oct. 5, 2021

(54) METHOD AND DEVICE FOR A HIGH TEMPERATURE VACUUM-SAFE SOLDER RESIST UTILIZING LASER ABLATION OF SOLDERABLE SURFACES FOR AN ELECTRONIC MODULE ASSEMBLY

(71) Applicant: Cree Fayetteville, Inc., Fayetteville, AR (US)

(72) Inventors: Jennifer Stabach, Rogers, AR (US); Brice McPherson, Fayetteville, AR (US); Chad B. O'Neal, Springdale, AR (US)

(73) Assignee: CREE, INC., Durham, NC (US)

( * ) Notice: Subject to any disclaimer, the term of this patent is extended or adjusted under 35 U.S.C. 154(b) by 69 days.

(21) Appl. No.: 16/133,411

(22) Filed: Sep. 17, 2018

(65) Prior Publication Data

US 2019/0015917 A1   Jan. 17, 2019

Related U.S. Application Data

(62) Division of application No. 14/954,243, filed on Nov. 30, 2015, now Pat. No. 10,076,800.

(51) Int. Cl.
*H05K 7/00* (2006.01)
*B23K 1/20* (2006.01)
(Continued)

(52) U.S. Cl.
CPC .............. *B23K 1/20* (2013.01); *B23K 1/0016* (2013.01); *B23K 26/361* (2015.10); *B23K 26/362* (2013.01); *H01L 23/13* (2013.01); *H05K 3/027* (2013.01); *H01L 23/3735* (2013.01); *H01L 23/49894* (2013.01); *H01L 2224/32225* (2013.01); *H05K 1/0263* (2013.01);
(Continued)

(58) Field of Classification Search
CPC ...... B23K 1/0016; B23K 1/20; B23K 26/361; B23K 26/362; H01L 2224/32225; H01L 23/13; H01L 23/3735; H01L 23/49894; H05K 1/0263; H05K 2201/09363; H05K 2203/0315; H05K 2203/1173; H05K 3/027; H05K 3/243; H05K 3/341
See application file for complete search history.

(56) References Cited

U.S. PATENT DOCUMENTS 3,339,008 A   8/1967  MacArthur et al.
4,498,096 A   2/1985  Addie et al.
(Continued)

FOREIGN PATENT DOCUMENTS

DE   102011010317   *  9/2012
EP   0540070 A1   5/1993
(Continued)

*Primary Examiner* — Yuriy Semenenko
(74) *Attorney, Agent, or Firm* — BakerHostetler

(57) ABSTRACT

A process for manufacturing an electronic component having attaches includes providing a first component having a first attach, forming trenches on a portion of the first attach with a laser to form a solder stop, and providing a second component comprising a second attach. The process further includes providing solder between the first attach and the second attach to form a connection between the first component and the second component, where the trenches contain the solder to a usable area. A device produced by the process is disclosed as well.

16 Claims, 8 Drawing Sheets

(51) Int. Cl.
  *B23K 1/00*    (2006.01)
  *H05K 3/02*    (2006.01)
  *B23K 26/361*  (2014.01)
  *B23K 26/362*  (2014.01)
  *H01L 23/13*   (2006.01)
  *H05K 1/02*    (2006.01)
  *H05K 3/24*    (2006.01)
  *H05K 3/34*    (2006.01)
  *H01L 23/373*  (2006.01)
  *H01L 23/498*  (2006.01)

(52) U.S. Cl.
  CPC ............ *H05K 3/243* (2013.01); *H05K 3/341* (2013.01); *H05K 2201/09363* (2013.01); *H05K 2203/0315* (2013.01); *H05K 2203/1173* (2013.01)

(56) References Cited

U.S. PATENT DOCUMENTS

| | | | |
|---|---|---|---|
| 5,230,145 A | 7/1993 | Caplan et al. | |
| 5,334,306 A | 8/1994 | Dautremont-Smith et al. | |
| 5,338,971 A | 8/1994 | Casati et al. | |
| 5,768,109 A | 6/1998 | Gulick et al. | |
| 5,883,012 A * | 3/1999 | Chiou | H01L 21/3083 216/41 |
| 6,139,972 A | 10/2000 | Trott et al. | |
| 6,150,275 A * | 11/2000 | Cho | C30B 29/06 438/696 |
| 6,307,755 B1 | 10/2001 | Williams et al. | |
| 6,433,299 B1 | 8/2002 | Varshney | |
| 6,822,342 B2 * | 11/2004 | Baluswamy | G03F 7/70633 257/797 |
| 6,900,393 B1 | 5/2005 | Cachina et al. | |
| 2004/0173942 A1 | 9/2004 | Kobayashi et al. | |
| 2005/0139992 A1 | 6/2005 | Holalkere et al. | |
| 2005/0220415 A1 | 10/2005 | Carr | |
| 2005/0275037 A1 * | 12/2005 | Chung | H01L 29/0649 257/374 |
| 2007/0108565 A1 | 5/2007 | Shim et al. | |
| 2007/0152018 A1 | 7/2007 | Cachina et al. | |
| 2007/0295482 A1 | 12/2007 | Fitzgerald et al. | |
| 2008/0142955 A1 | 6/2008 | Chen et al. | |
| 2008/0230587 A1 | 9/2008 | Yang | |
| 2009/0079002 A1 * | 3/2009 | Lee | H01L 29/0634 257/355 |
| 2010/0089979 A1 * | 4/2010 | Irslinger | B23K 1/19 228/176 |
| 2011/0204261 A1 | 8/2011 | Dahm et al. | |
| 2011/0267781 A1 * | 11/2011 | Takayanagi | H01L 23/36 361/720 |
| 2011/0308847 A1 | 12/2011 | Normann | |
| 2012/0193139 A1 | 8/2012 | Okuyama et al. | |
| 2012/0306087 A1 * | 12/2012 | Bayerer | H01L 24/83 257/772 |
| 2013/0021789 A1 | 1/2013 | Dahm | |
| 2013/0133871 A1 | 5/2013 | Ma et al. | |
| 2015/0223329 A1 | 8/2015 | Brunner et al. | |

FOREIGN PATENT DOCUMENTS

| | | |
|---|---|---|
| JP | 7153884 | 6/1995 |
| JP | 2006135270 A | 5/2006 |
| JP | 2008198635 A | 8/2008 |
| JP | 4586508 B2 | 11/2010 |
| WO | 2004036967 A1 | 4/2004 |
| WO | 2005043966 A1 | 5/2005 |

\* cited by examiner

METHOD AND DEVICE FOR A HIGH TEMPERATURE VACUUM-SAFE SOLDER RESIST UTILIZING LASER ABLATION OF SOLDERABLE SURFACES FOR AN ELECTRONIC MODULE ASSEMBLY

CROSS REFERENCE TO PRIOR APPLICATIONS

This application is a divisional of the U.S. patent application Ser. No. 14/954,243, filed Nov. 30, 2015 now U.S. Pat. No. 10,076,800 issued Sep. 18, 2018, which is incorporated herein by reference in its entirety.

STATEMENT REGARDING FEDERALLY SPONSORED RESEARCH OR DEVELOPMENT

This invention was made with Government support under reference numbers 2511 DOE VTP WBG Traction Inverter DE-EE0006429, 2501 AFIII 10-C-2124, and 2503 DOE High Voltage MCPM Phase II SC0008239. The United States government has certain rights in the invention.

BACKGROUND OF THE DISCLOSURE

Solder resist is a common method to prevent an overflow of molten solder during a reflow process. It is standard in the printed circuit board industry. Solder resist is typically a polymer that is either patterned with photolithography on a laminated film or deposited by screen printing and solidified with a thermal or ultraviolet (UV) cure. The addition of a solder mask is an additional manufacturing process which requires liquid processing (in the case of a laminated film) or a thermal or UV cure (for a screen printed layer), each of which adds time, cost, tooling, and complexity in a module build.

Accordingly, there is a need for an alternative to solder resist.

SUMMARY OF THE DISCLOSURE

According to an aspect of the disclosure, a process for manufacturing an electronic component having attaches includes providing a first component having a first attach, forming trenches on a portion of the first attach with a laser to form a solder stop, providing a second component comprising a second attach, and providing solder between the first attach and the second attach to form a connection between the first component and the second component, where the trenches contain the solder to a usable area.

According to an aspect of the disclosure, an electronic component having attaches includes a first component having a first attach, trenches arranged on a portion of the first attach with a laser to form a solder stop, a second component having a second attach, and solder arranged between the first attach and the second attach configured to connect the first component to the second component, where the trenches contain the solder to a usable area.

According to an aspect of the disclosure, an electronic component having attaches includes a first component having a first attach, trenches arranged on a portion of the first attach to form a solder stop, a second component having a second attach, and solder arranged between the first attach and the second attach configured to connect the first component to the second component, where the trenches are configured by one of the following: a portion of a surface being removed from the first component and a portion of a surface of the first component being oxidized, and where the trenches contain the solder to a usable area.

Additional features, advantages, and aspects of the disclosure may be set forth or apparent from consideration of the following detailed description, drawings, and claims. Moreover, it is to be understood that both the foregoing summary of the disclosure and the following detailed description are exemplary and intended to provide further explanation without limiting the scope of the disclosure as claimed.

BRIEF DESCRIPTION OF THE DRAWINGS

The accompanying drawings, which are included to provide a further understanding of the disclosure, are incorporated in and constitute a part of this specification, illustrate aspects of the disclosure and together with the detailed description serve to explain the principles of the disclosure. No attempt is made to show structural details of the disclosure in more detail than may be necessary for a fundamental understanding of the disclosure and the various ways in which it may be practiced. In the drawings.

DETAILED DESCRIPTION OF THE DISCLOSURE

Figure 1:
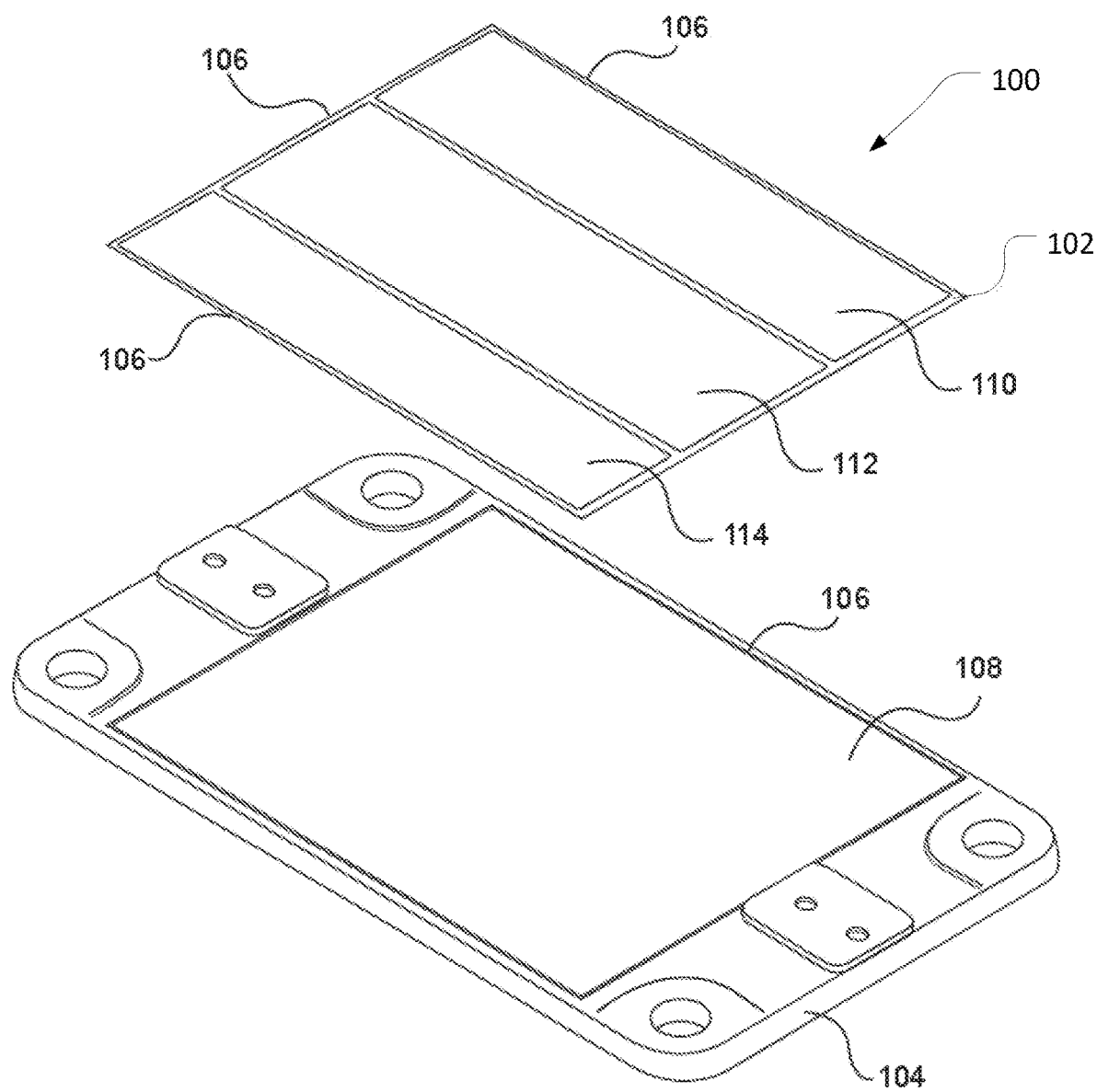
FIG. 1 shows a partial exploded view of a power electronic module assembly according to the principles of the disclosure.

The aspects of the disclosure and the various features and advantageous details thereof are explained more fully with reference to the non-limiting aspects and examples that are described and/or illustrated in the accompanying drawings and detailed in the following description. It should be noted that the features illustrated in the drawings are not necessarily drawn to scale, and features of one aspect may be employed with other aspects as the skilled artisan would recognize, even if not explicitly stated herein. Descriptions of well-known components and processing techniques may be omitted so as to not unnecessarily obscure the aspects of the disclosure. The examples used herein are intended merely to facilitate an understanding of ways in which the disclosure may be practiced and to further enable those of skill in the art to practice the aspects of the disclosure. Accordingly, the examples and aspects herein should not be construed as limiting the scope of the disclosure, which is defined solely by the appended claims and applicable law. Moreover, it is noted that like reference numerals represent similar parts throughout the several views of the drawings.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

This disclosure is directed to a solder stop device and method for an electronic module assembly utilizing laser ablation of solderable surfaces, and particularly to a system and method for a high temperature vacuum-safe solder stop device and method for an electronic module assembly utilizing laser ablation of solderable surfaces.

Solder resist can be problematic for power modules intended for high temperature operation. Typical solder resist materials are not capable of withstanding the high temperature processes common in the soldered attaches necessary in these products. In this regard, the solder resist may burn, discolor, flake, and contaminate a vacuum oven environment. Additionally, solder resist may outgas in operation (either through self-decomposition or from evaporation of absorbed moisture) which can be problematic in a high voltage assembly with a gel encapsulation.

This disclosure details a device and method of containing the flow of solder. As noted above, solder masks are problematic in high temperature attach processes, where the polymer solder masks may burn, outgas, and degrade. The method of the disclosure utilizes a laser to remove plated surfaces (e.g., nickel plating, gold plating, and the like) and to oxidize the underlying base metal (e.g., copper, aluminum, or the like). However, other processes that may discretely remove plated surfaces and/or discretely oxidize services are contemplated as well including plasma-based processes, electron beam processes, and the like. Nevertheless, for brevity of description, the invention will be described in conjunction with a laser process, but should not be limited thereto. The method may be implemented with a laser engraver, a laser scriber, or other laser device. The area processed by the laser produces trenches resulting in a barrier region that inhibits a flow of solder such that the solder does not spread over critical regions of an assembly. The laser trenches are not affected by high temperatures, do not outgas, are safe in a vacuum, are rapidly formed, and do not require custom tooling between different designs. High temperatures as contemplated by the disclosure are temperatures greater than 175° C. (347° F.). However, aspects of the disclosure are equally applicable to lower temperature ranges.

FIG. 1 shows a partial exploded view of a power electronic module assembly according to the principles of the disclosure. In particular, FIG. 1 shows a power electronic module 100 that may include a substrate 102 that may be attached to a base plate 104. The base plate 104 may include attaches 108. Surrounding or on the attaches 108 may be a trench 106 formed by laser ablation processes or the like.

The base plate 104 may include plated surfaces. The plated surfaces may include one or more of nickel plating and gold plating. Other types of plating materials are contemplated as well including one or more of nickel, silver, palladium, and gold. The base plate 104 may further include an underlying base metal. The base metal may include one or more of copper and aluminum. Other types of base metals are contemplated as well.

The substrate 102 may include a plurality of attaches. In the aspect shown in FIG. 1, the substrate 102 may include attaches 110, may include attaches 112, and may include attaches 114. Surrounding or on the attaches 110 may be a trench 106 formed by laser ablation; surrounding or on the attaches 112 may be a trench 106 formed by laser ablation; and surrounding or on the attaches 114 may be a trench 106 formed by laser ablation according to the disclosure.

The substrate 102 may include plated surfaces. The plated surfaces may include one or more of nickel plating and gold plating. Other types of plating materials are contemplated as well including one or more of nickel, silver, palladium, and gold. The base plate 104 may further include an underlying base metal. The base metal may include one or more of copper and aluminum. Other types of base metals are contemplated as well.

In one aspect, the trench 106 may be configured with a polygonal shape. In another aspect the trench 106 may be a continuous closed loop structure. In another aspect, the trench 106 may be positioned such that the solder arranged between two components, e.g., the base plate and the substrate, may form a fillet structure therebetween. In another aspect, the trench 106 may have a width of approximately 1 mm (approximately 0.04 inches). In another aspect, the trench 106 may have a width of approximately of 0.9 mm to 1.1 mm. In another aspect, the trench 106 may have a width of approximately of 0.7 mm to 1.3 mm. In another aspect, the trench 106 may have a width of approximately of 0.5 mm to 1.5 mm. In another aspect, the trench 106 may have a width of approximately of 0.5 mm to 5 mm. In another aspect, the trench 106 may have a width based on how well the solder flows, based on a component plating, based on a component surface finish, based on a reflow temperature profile and/or pressure profile, based on a thermal mass of parts being attached, and/or the like.

It should be noted that the FIG. 1 aspect of the power electronic module 100 including the substrate 102 and the base plate 104 with the various attaches 108, 110, 112, and 114 is merely exemplary. The disclosure contemplates any number of attaches, any configuration of attaches, and any arrangement attaches. Moreover, the disclosure contemplates any type of device or component having attaches that utilize solder.

Figure 2:
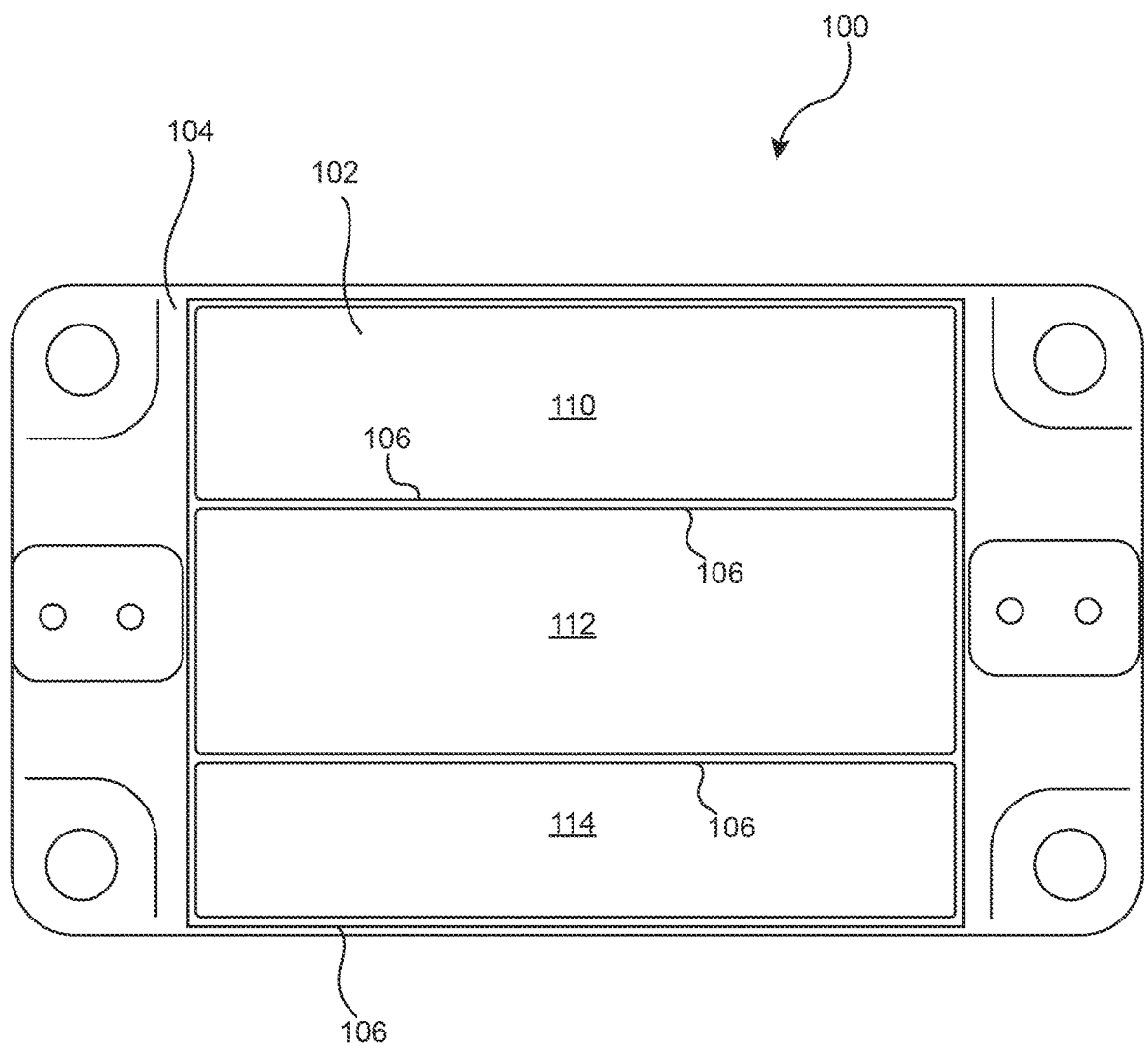
FIG. 2 shows a partial power electronic module according to the principles of the disclosure.

FIG. 2 shows a partial power electronic module according to the principles of the disclosure. In particular, FIG. 2 shows the power electronic module 100 with the substrate 102 and the base plate 104 assembled.

Figure 3:
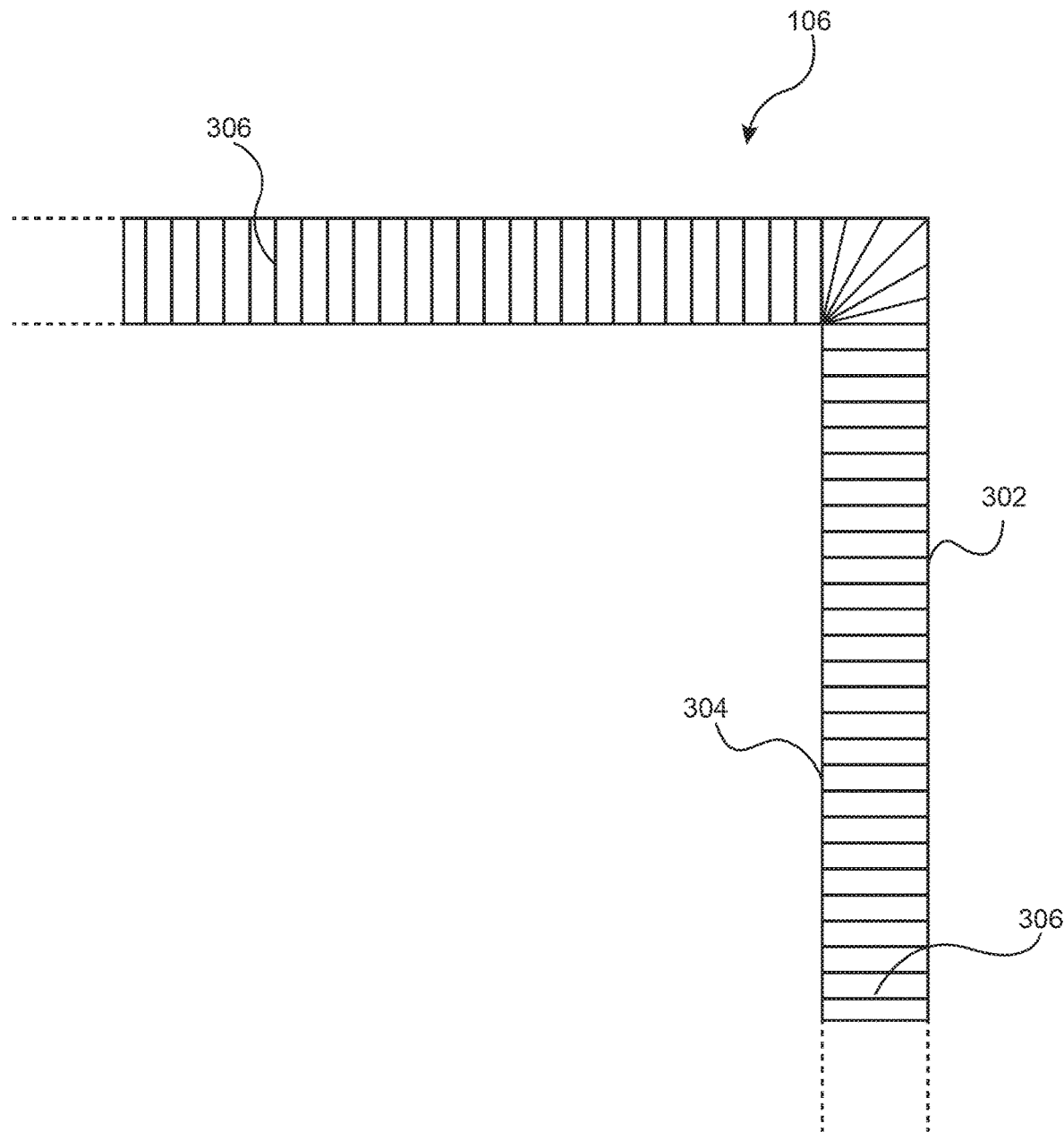
FIG. 3 shows an exemplary trench for a solder stop for a power electronic module assembly according to the principles of the disclosure.

FIG. 3 shows a partial exemplary trench for a solder stop for a power electronic module assembly according to the principles of the disclosure. In particular, FIG. 3 shows a trench 106 that may include an outside boundary trench 302 and an inside boundary trench 304. The trench 106 may further include additional trench portions 306 extending between the outside boundary trench 302 and the inside boundary trench 304. Each of the outside boundary trench 302, the inside boundary trench 304, and additional trench portions 306 may be formed by laser ablation. In one aspect, the outside boundary trench 302 may be generally parallel to the inside boundary trench 304. In one aspect, a longitudinal axis of the outside boundary trench 302 and a longitudinal axis the inside boundary trench 304 may be perpendicular to a longitudinal axis of at least some of the additional trench portions 306. The disclosed shape and construction of the trenches has been determined to limit solder wetting. However, other shapes and constructions are contemplated as well.

In one aspect, the outside boundary trench 302, the inside boundary trench 304, and the additional trench portions 306 may have the same width. In one aspect, the outside boundary trench 302, the inside boundary trench 304, and the additional trench portions 306 may have the different widths. In one aspect, the outside boundary trench 302, the inside boundary trench 304, and the additional trench portions 306 may have the same depth. In one aspect, the outside boundary trench 302, the inside boundary trench 304, and the additional trench portions 306 may have the different depths.

Figure 4:
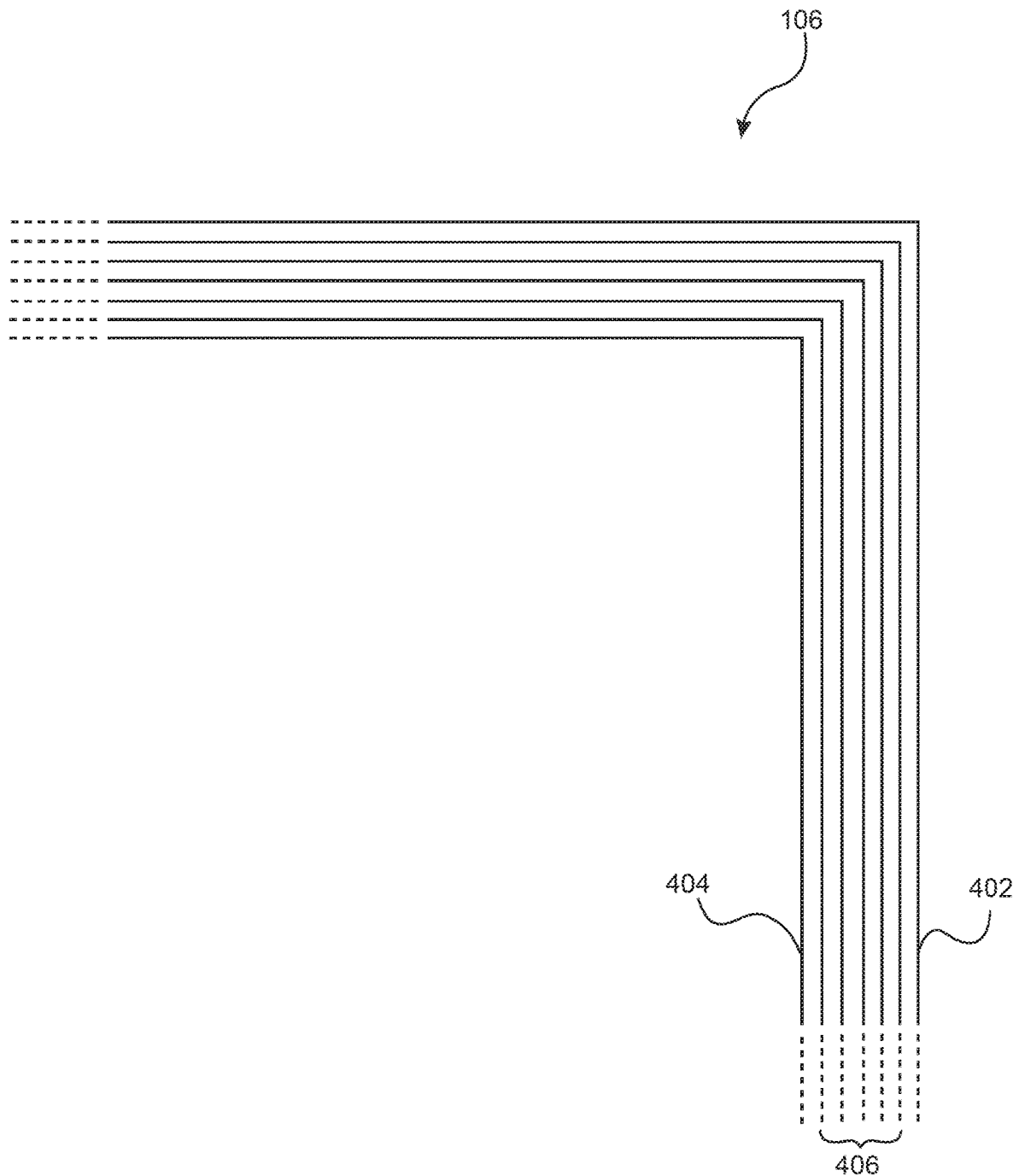
FIG. 4 shows another exemplary trench for a solder stop for a power electronic module assembly according to the principles of the disclosure.

FIG. 4 shows another exemplary trench for a solder stop for a power electronic module assembly according to the principles of the disclosure. In particular, FIG. 4 shows a trench 106 that may include an outside boundary trench 402 and an inside boundary trench 404. The trench 106 may further include additional trench portions 406 extending parallel to the outside boundary trench 402 and the inside boundary trench 404. Each of the outside boundary trench 402, the inside boundary trench 404, and additional trench portions 406 may be formed by laser ablation according to the disclosure. The disclosed shape and construction of the trenches has been determined to limit solder wetting. However, other shapes and constructions are contemplated as well. In one aspect the outside boundary trench 402, the inside boundary trench 404, and additional trench portions 406 may have the same width. In one aspect the outside boundary trench 402, the inside boundary trench 404, and additional trench portions 406 may have the different widths. In one aspect the outside boundary trench 402, the inside boundary trench 404, and additional trench portions 406 may have the same depth. In one aspect the outside boundary trench 402, the inside boundary trench 404, and additional trench portions 406 may have the different depths.

Figure 5:
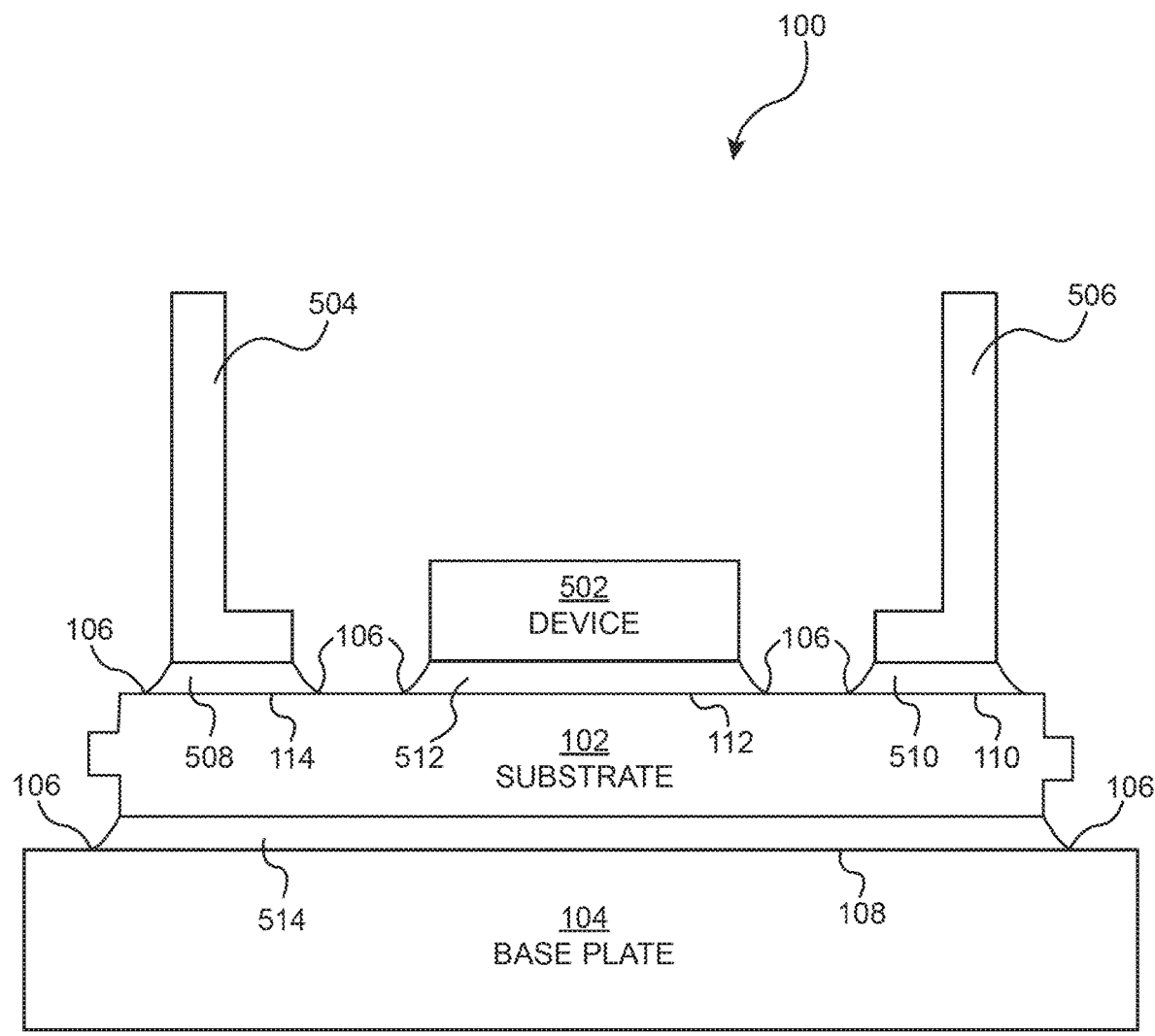
FIG. 5 shows a power electronic module assembly after processing with connected components according to the principles of the disclosure.

FIG. 5 shows a power electronic module assembly after processing with connected components according to the principles of the disclosure. In particular, FIG. 5 shows the base plate 104 and the attaches 108 having solder 514 contained between the trenches 106 to attach the substrate 102. The trenches 106 may be arranged and configured such that the solder 514 forms a fillet.

As further shown in the aspect of FIG. 5, the substrate 102 may include the attaches 110 having solder 510 contained between the trenches 106 to hold a contact 506. The trenches 106 may be arranged and configured such that the solder 510 forms a fillet.

Further shown in FIG. 5, the substrate 102 may further include the attaches 112 having solder 512 contained between the trenches 106 to attach the device 502. The trenches 106 may be arranged and configured such that the solder 512 forms a fillet.

Finally, the substrate 102 as shown in the FIG. 5 aspect may include the attaches 114 having solder 508 held between the trenches 106 to hold a contact 504. The trenches 106 may be arranged and configured such that the solder 508 forms a fillet.

It should be noted that the FIG. 5 aspect of the power electronic module 100 including the substrate 102 and the base plate 104 with the various attaches 108, 110, 112, and 114, and the components including the device 502, a contact 504, and the contact 506 is merely exemplary. The disclosure contemplates any type of device and components having attaches that utilize solder.

Moreover, the trenches 106 of the disclosure may function as a solder stop in power modules and other components. An effective soldered bond produced according to the disclosure for a power electronics module and other components will be strong, highly conductive, and stable metallurgically. There are numerous soldered attaches present in a power module, including attaches to provide the following connections:

Substrate to Base Plate;
Substrate to Heat Spreader;
Substrate to Base Plate and Heat Spreader;
Electrical terminals to Substrate;
Semiconductor Devices to the Substrate; and
Passive Elements (resistors, capacitors, sensors, etc.) to the Substrate.

Figure 6:
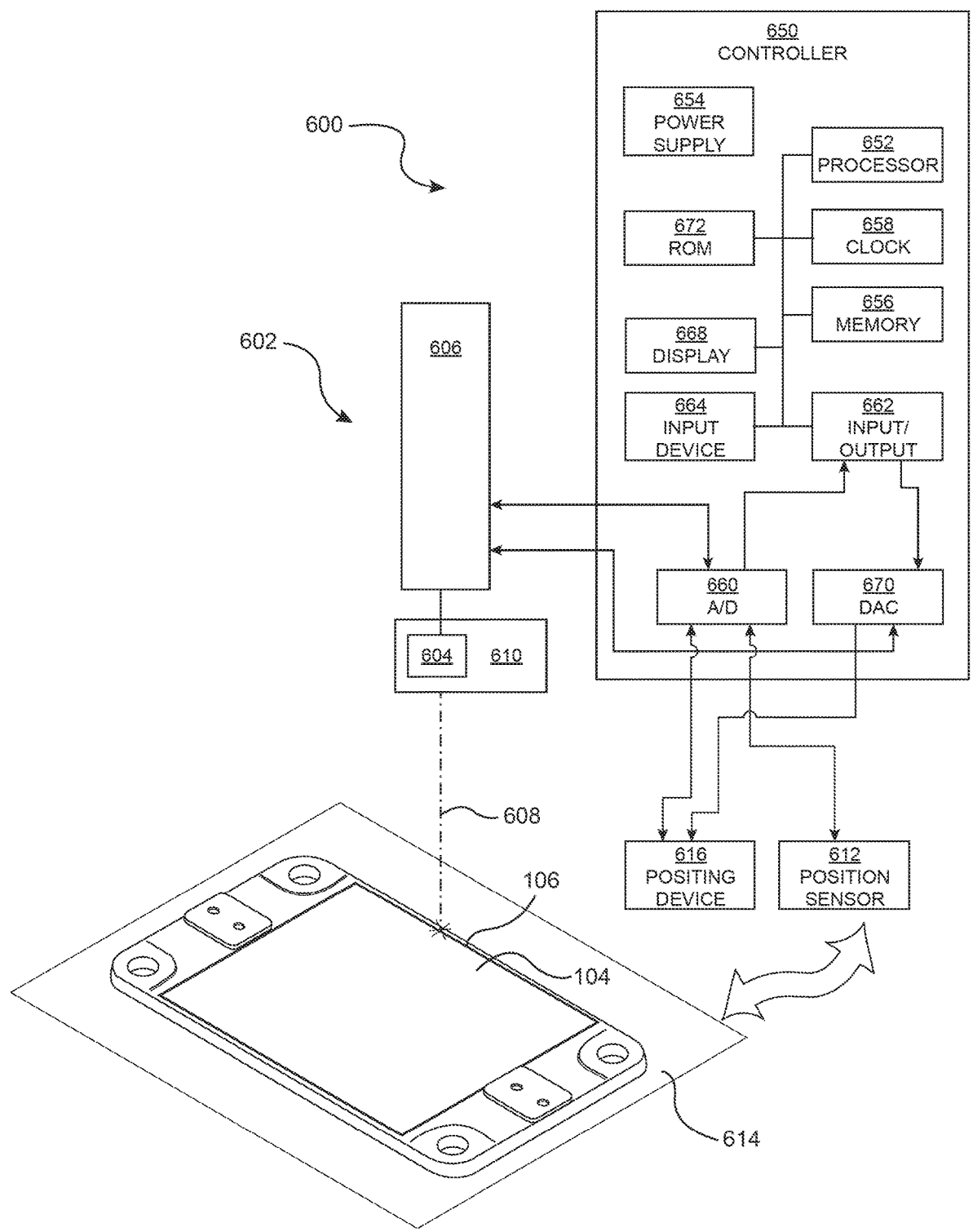
FIG. 6 shows a device for laser ablation according to the principles of the disclosure.

FIG. 6 shows a device for generating solder stop trenches according to the principles of the disclosure. The device 600 may be implemented using a laser engraving machine, laser patterning system, laser scriber, laser ablation device, or the like to produce trenches 106 on the base plate 104 to act as functional solder masking. In a similar manner, the device 600 may produce trenches 106 on the substrate 102 (not shown) and/or other components (not shown) to act as functional solder masking. The device 600 may burn off thin plating layers on the base plate 104 and/or substrate 102 and may heavily oxidize the underlying metal of the base plate 104 and/or substrate 102 with a focused laser light 608. The resulting trenches 106 generate a 'dead zone' barrier where molten solder may be unable to adhere to due to the oxidization and/or where molten solder may be unable flow over from an increased surface to liquid tension.

In one aspect, the device 600 may operate to form the trench 106 in atmosphere to promote oxidation. In another aspect, the device 600 may operate to form the trench 106 while exposed to oxygen to promote oxidation. In another aspect, the device 600 may operate to form the trench 106 while exposed to other gases to promote oxidation.

The device 600 may fill areas of the trenches 106 by scribing lines with the focused laser light 608 in controlled patterns. The width and depth of the trenches 106 may be controllable through pattern generation and laser settings on the device 600. The device 600 may have settings that include frequency, power, speed, vector configuration, and repetitions. In one aspect, the device 600 may have a laser power of 80 to 100% (where max power is approximately 4 W to 8 W), a scan speed 50 mm/s to 250 mm/s (depending on the amount of masking is needed), a Qsw frequency of 25 kHz, a spot variable of −33, and may utilize 1 to 5 repetitions (depending on the amount of masking needed). Geometry may be generated directly from computer aided design (CAD) files and imported into the device 600. FIGS. 3 and 4 illustrate the geometry of the trench 106 that may be implemented with various laser cuts and filling techniques. An external boundary may be determined, after which the scanning laser subdivides and scribes discrete lines (302, 304, 306, 402, 404, 406). The line density and repetition settings may be controlled by the device 600 by hardware and/or software.

The device 600 may include a controller 650 that may receive sensor outputs from a temperature sensor sensing temperature from any part of the associated system. The controller 650 may receive sensor outputs from a position sensor 612 that may sense a position of a part of the base plate 104, substrate 102, or any other components being processed by the device 600. In one aspect, the position sensor 612 may sense a position of a support 614 that is supporting a part of the base plate 104, substrate 102, and any other components being processed by the device 600. The controller 650 may move the support 614 in order to form the trenches 106 in the desired locations of the base plate 104, substrate 102, or any other components being processed by the device 600 with a positioning device 616. The positioning device 616 may include one or more positioning motors to position the support 614 at the desired location. The positioning device 616 may be implemented in numerous other ways. Alternatively, the positioning device 616 may position the device 600 and the sensor 612 may determine the position of the device 600 while the support 614 is stationary.

The controller 650 may include a processor 652. This processor 652 may be operably connected to a power supply 654, a memory 656, a clock 658, an analog to digital converter (A/D) 660, an input/output (I/O) port 662, and the like.

The processor 652 may control the device 600 to operate the laser to generate a width and depth of the trenches 106 through pattern generation. The processor 652 may control the device 600 to operate the laser with particular frequency, power, speed, vector configuration, and repetitions. The processor 652 may control the device 600 to operate the laser based on computer aided design (CAD) files stored in memory 656.

The I/O port 662 may be configured to receive signals from any suitably attached electronic device and forward these signals from the ND 660 and/or to processor 652. The signal includes signals from the temperature sensor sensing temperature, the position sensor 612 sensing position, and the like. If the signals are in analog format, the signals may proceed via the ND 660. In this regard, the ND 660 may be configured to receive analog format signals and convert these signals into corresponding digital format signals.

The controller 650 may include a digital to analog converter (DAC) 670 that may be configured to receive digital format signals from the processor 652, convert these signals to analog format, and forward the analog signals from the I/O port 662. In this manner, electronic devices configured to utilize analog signals may receive communications or be driven by the processor 652. The processor 652 may be configured to receive and transmit signals to and from the DAC 670, ND 660 and/or the I/O port 662. The processor 652 may be further configured to receive time signals from the clock 658. In addition, the processor 652 is configured to store and retrieve electronic data to and from the memory 656 including the CAD files. The controller 650 may further include a display 668, an input device 664, and a read-only memory (ROM) 672. Finally, the processor 652 may include a program stored in the memory 656 executed by the processor 652 to execute the method 800 described below.

A laser 602 may include a gain medium 604, a mechanism to energize 606 the gain medium 604, and a device to provide optical feedback 610. The gain medium 604 may be a material with properties that allow it to amplify light by way of stimulated emission. Light of a specific wavelength that passes through the gain medium 604 may be amplified to increase power. For the gain medium 604 to amplify light, the gain medium 604 may be supplied with energy in a pumping process. The energy may be supplied as an electric current or as light at a different wavelength. Pump light may be provided by a flash lamp or by another laser. The laser may implement the optical feedback 610 with an optical cavity. In one aspect, the feedback may be implemented by a pair of mirrors on either end of the gain medium 604. Light bounces back and forth between the mirrors, passing through the gain medium 604 and being amplified each time. Typically one of the two mirrors, an output coupler, may be partially transparent. Some of the focused laser light 608 escapes through this mirror to form the trench 106 in the base plate 104. Likewise, the other trenches 106 in the substrate 102 or any other component may be likewise formed from the laser 602. However, it should be noted that other implementations of the laser device, laser scriber, and/or laser engraver may be utilized as well.

Figure 7:
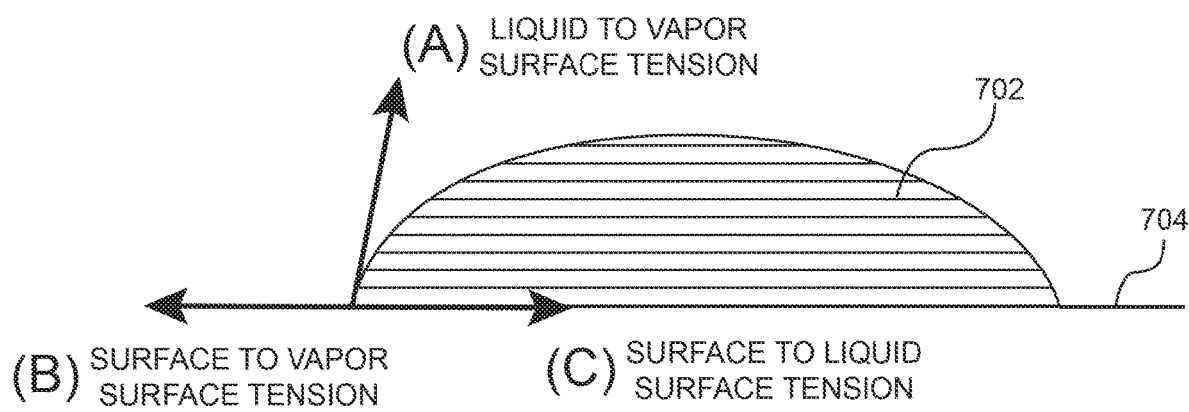
FIG. 7 shows details of solder application according to the principles of the disclosure.

FIG. 7 shows details of solder application according to the principles of the disclosure. For a suitable bond to form, solder must be compatible with the base metal and flow evenly over all surfaces. Spreading of the molten solder alloy is referred to as wetting, and is driven by a balance between surface tensions. These include the tensions depicted in FIG. 7. The angle between (A) and (C) is referred to as the contact angle of the liquid 702. An effective soldered bond will have a low contact angle, which results in the solder activating and spreading over the metal surfaces 704 in a joint such as the attaches 108, 110, 112, 114. When bonding between surfaces, these surface tensions are repeated at each interface.

There are many techniques to enhance solder wetting:
Increasing the surface to vapor tension by cleaning the exposed metal.

Decreasing the surface to liquid tension by increasing the temperature or by changing the surface materials (i.e. through metal plating).

Decreasing the liquid to vapor tension by reducing the atmospheric pressure.

Often flux is added to a solder paste, preform or ribbon system to provide two of these methods: (1) surface cleaning by reducing the oxides on the metal surfaces and (2) promotion or wetting through reduced surface tension. Flux is highly effective at this; however, the gas and solid residues from flux can create lasting voids in the solder bond. These voids inhibit the flow of electric current as well as the removal of heat. Voids located directly underneath a power device can result in a loss of performance at best and a complete module failure at worst.

Soldered attaches may be formed without a liquid flux, by starting with a clean, oxide free surface and/or (2) processing in a reducing atmosphere such as hydrogen. This is often performed in a vacuum/pressure reflow oven. These flux free bonds are highly effective as they can result in low voiding, however, they introduce a number of processing issues due to the nature of the vacuum reflow process.

One of these major issues is the balance of solder spreading. Too little spreading is an indicator of a low quality bond, while too much may result in overflow. This overflow may contaminate other functional surfaces such as threaded holes, wire bond pads, aesthetical features and the like. The overflow issue is challenging in a vacuum reflow process, as the heating and cooling rates are limited. Accordingly, the solder may be liquid longer than desired which can result in additional overflow.

The trenches 106 generated by aspects of the disclosure may impede solder wetting and thus provide a solder stop. This impeded solder wetting may be in response to decreasing the surface to vapor tension by oxidizing the exposed metal. This impeded solder wetting may be in response to increasing the surface to liquid tension by changing the surface materials through the removal of metal plating. This impeded solder wetting may be in response to decreasing the surface to vapor tension by oxidizing the exposed metal and by changing the surface materials through the removal of metal plating.

Figure 8:
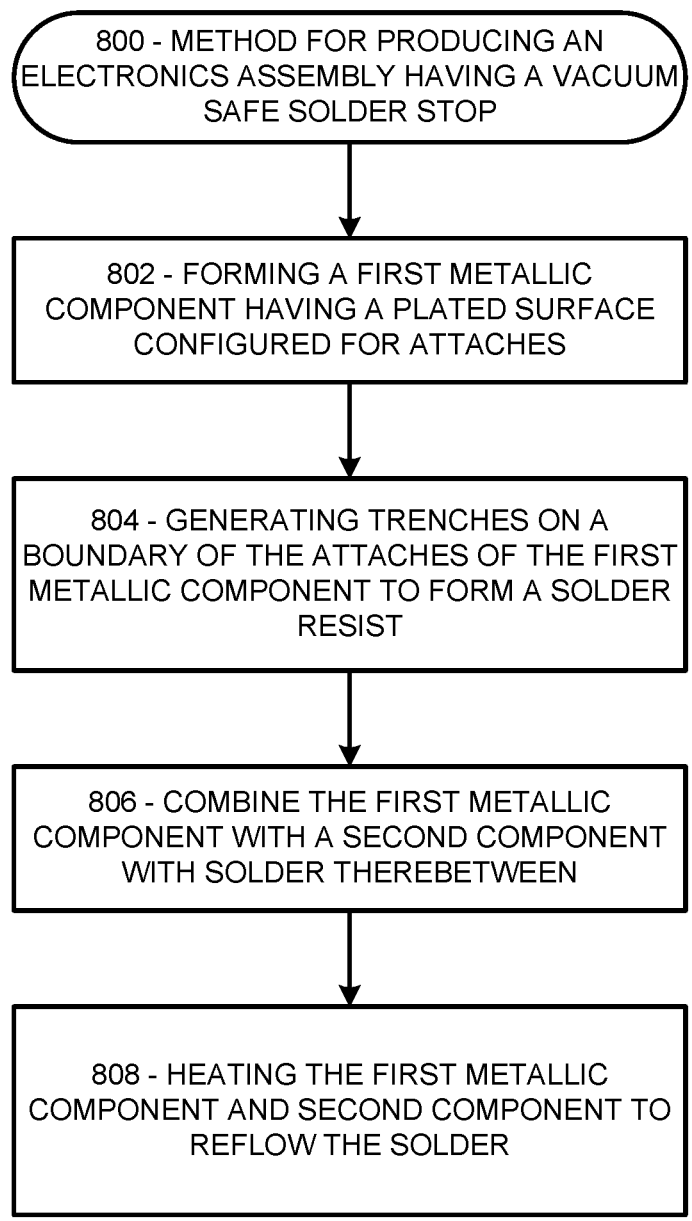
FIG. 8 shows a process for utilizing laser ablation according to the principles of the disclosure.

FIG. 8 shows a process for utilizing laser ablation according to the principles of the disclosure. In particular, FIG. 8 shows a method 800 for producing an electronics assembly having a vacuum safe solder stop. In block 802, a first metallic component having a plated surface configured for attaches may be formed. In one aspect, the plating may include electroless nickel, immersion gold (ENIG) plating with a nickel thickness 2 to 8 µm and a gold thickness 0.125 µm to 0.3 µm. However, it is noted that in other aspects, other plating thicknesses, other plating materials, other plating processes, and/or no plating at all may be utilized for the first metallic component or other component. The first metallic component may be a power electronic module 100 that may include the substrate 102 that may be attached to a base plate 104. The first metallic component may be the substrate 102 that may include a plurality of attaches. The first metallic component may be any type of device having attaches that utilize solder.

In block 804, a laser such as a laser implemented using the device 600 may generate trenches on a predetermined area of the attaches of the first metallic component to form a solder stop. In one aspect, a laser such as a laser implemented using the device 600 may generate trenches on a boundary of the attaches of metallic component to form a solder stop. In a particular aspect, trenches such as trenches 106 shown in FIG. 3, FIG. 4, or similar trench structures may be formed that resist the wetting of solder.

In block 806, the first metallic component may be combined with a second component with solder therebetween. Moreover, a plurality of components may be combined with the first metallic component.

In block 808, the first metallic component, second component, and any other desired components may be heated to reflow the solder. In one aspect the heating may take place in an oven. In another aspect, heating may take place in a vacuum oven. In yet another aspect, the heating may utilize a belt furnace. Thereafter, in some aspects, the components may be encapsulated in a gel material.

There are substantial benefits to this approach. Most notably these include (1) high temperature processing stability, (2) safe to use in a vacuum, (3) no outgassing, (4) capability to mask three dimensional structures, (5) compatible with many different materials, (6) high level of precision and control, (7) no photolithographic or mesh screen tooling required, (8) no immersion, heated, or UV processing required, (9) a rapid process time, (10) high degree of flexibility, (11) favorable for rapid prototyping, and the like.

Aspects of the disclosure may be implemented in any type of computing devices, such as, e.g., a desktop computer, personal computer, a laptop/mobile computer, a tablet computer, cloud computing device, and the like, with wired/wireless communications capabilities via communication channels.

Further in accordance with various aspects of the disclosure, the methods described herein are intended for operation with dedicated hardware implementations including, but not limited to, PCs, semiconductors, application specific integrated circuits (ASIC), programmable logic arrays, cloud computing devices, and other hardware devices constructed to implement the methods described herein.

It should also be noted that the software implementations of the disclosure as described herein are optionally stored on a tangible storage medium, such as: a magnetic medium such as a disk or tape; a magneto-optical or optical medium such as a disk; or a solid state medium such as a memory card or other package that houses one or more read-only (non-volatile) memories, random access memories, or other re-writable (volatile) memories. A digital file attachment to email or other self-contained information archive or set of archives is considered a distribution medium equivalent to a tangible storage medium. Accordingly, the disclosure is considered to include a tangible storage medium or distribution medium, as listed herein and including art-recognized equivalents and successor media, in which the software implementations herein are stored.

Additionally, the various aspects of the disclosure may be implemented in a non-generic computer implementation associated with a laser engraver, a laser scriber, or other laser device. Moreover, the various aspects of the disclosure set forth herein improve the functioning of solder stop production system as is apparent from the disclosure hereof. Furthermore, the various aspects of the disclosure involve computer hardware that it specifically programmed to solve the complex problem addressed by the disclosure. Accordingly, the various aspects of the disclosure improve the functioning of the system overall in its specific implementation to perform the process set forth by the disclosure and as defined by the claims.

While the disclosure has been described in terms of exemplary aspects, those skilled in the art will recognize that the disclosure can be practiced with modifications in the spirit and scope of the appended claims. These examples given above are merely illustrative and are not meant to be an exhaustive list of all possible designs, aspects, applications or modifications of the disclosure.

What is claimed is:

1. An electronic component having attaches comprising:
a first component comprising a surface that comprises a first attach;
a second component comprising a second attach;
solder arranged between the first attach and the second attach to connect the first component to the second component; and
a plurality of trenches arranged on the surface of the first component, the plurality of trenches being configured to form a barrier region that inhibits a flow of the solder across the surface of the first component, at least one of the plurality of trenches comprises a boundary trench, and the plurality of trenches comprise a plurality of trench portions that extend in a direction to intersect the boundary trench,
wherein the plurality of trenches are configured such that the solder is contained between the plurality of trenches on the first attach; and
wherein the plurality of trenches are configured such that the solder forms a solder fillet between the first component and the second component.

2. The electronic component of claim 1
wherein at least one of the plurality of trenches comprises an oxidized portion of the surface of the first component to limit solder wetting; and
wherein the oxidized portion is configured to form a barrier region that inhibits a flow of the solder.

3. The electronic component of claim 1
wherein at least one of the plurality of trenches comprises a removed portion of the surface of the first component to limit solder wetting; and
wherein the removed portion is configured to form a barrier region that inhibits a flow of the solder.

4. The electronic component of claim 1
wherein at least one of the plurality of trenches forms a continuous closed-loop structure;
wherein the first component further comprises a plated surface and at least a portion of the plated surface is configured as the first attach;
wherein the first component comprises a metallic construction;
wherein the metallic construction further comprises at least one of the following: aluminum and copper; and
wherein the plated surface comprises at least one of the following: nickel, silver, palladium, and gold.

5. The electronic component of claim 1
wherein the first component comprises one of the following: a substrate of a power electronic module, a semiconductor device, and a base plate of a power electronic module.

6. The electronic component of claim 1 wherein the plurality of trenches comprise at least one additional trench arranged parallel to the boundary trench.

7. An electronic component having attaches comprising:
a first component comprising a surface that comprises a first attach;
a second component comprising a second attach;
solder arranged between the first attach and the second attach to connect the first component to the second component; and
a plurality of trenches arranged on the surface of the first component, the plurality of trenches being configured to form a barrier region that inhibits a flow of the solder across the surface of the first component, and at least one of the plurality of trenches comprises an inside boundary trench and an outside boundary trench,
wherein the plurality of trenches are configured such that the solder is contained between the plurality of trenches on the first attach; and
wherein the plurality of trenches comprise a plurality of trench portions arranged between the inside boundary trench and the outside boundary trench, and the plurality of trench portions extend in a direction to intersect the inside boundary trench and the outside boundary trench.

8. The electronic component of claim 7
wherein at least one of the trenches comprises an oxidized portion of the surface of the first component; and
wherein the oxidized portion is configured to limit solder wetting and to form a barrier region that inhibits a flow of the solder.

9. The electronic component of claim 7
wherein at least one of the trenches comprises a removed portion of the surface of the first component; and
wherein the removed portion is configured to limit solder wetting and to form a barrier region that inhibits a flow of the solder.

10. The electronic component of claim 7
wherein the first component further comprises a plated surface and at least a portion of the plated surface is configured as the first attach;
wherein the first component comprises a metallic construction;
wherein the metallic construction further comprises at least one of the following: aluminum and copper; and
wherein the plated surface comprises at least one of the following: nickel, silver, palladium, and gold.

11. The electronic component of claim 7 wherein;
the first component comprises one of the following: a substrate of a power electronic module, a semiconductor device, and a base plate of a power electronic module; and
wherein at least one of the trenches forms a continuous closed-loop structure.

12. An electronic component having attaches comprising:
a first component comprising a surface that comprises a first attach;
a second component comprising a second attach;
solder arranged between the first attach and the second attach to connect the first component to the second component; and
trenches arranged on the surface of the first component, the trenches being configured to form a barrier region that inhibits a flow of the solder across the surface of the first component,
wherein the trenches comprise at least two boundary trenches and at least one additional trench arranged between the at least two boundary trenches; and
wherein the at least two boundary trenches comprise a plurality of parallel boundary trenches and the at least one additional trench further comprises a plurality of trench portions arranged between the plurality of parallel boundary trenches, and the plurality of trench portions extend in a direction to intersect the plurality of parallel boundary trenches.

13. The electronic component of claim 12 wherein the trenches comprise at least one of the following to limit solder wetting: an oxidized portion of the surface of the first component or a removed portion of the surface of the first component.

14. The electronic component of claim 12
wherein the first component further comprises a plated surface and at least a portion of the plated surface is configured as the first attach;
wherein the first component comprises a metallic construction;
wherein the metallic construction further comprises at least one of the following: aluminum and copper; and
wherein the plated surface comprises at least one of the following: nickel, silver, palladium, and gold.

15. The electronic component of claim 12 wherein:
the first component comprises one of the following: a substrate of a power electronic module, a semiconductor device, and a base plate of a power electronic module; and
at least one of the trenches forms a continuous closed-loop structure.

16. An electronic component having attaches comprising:
a first component comprising a surface that comprises a first attach;
a second component comprising a second attach;
solder arranged between the first attach and the second attach to connect the first component to the second component; and
trenches arranged on the surface of the first component, the trenches being configured to form a barrier region that inhibits a flow of the solder across the surface of the first component, and at least one of the trenches comprises an inside boundary trench and an outside boundary trench,
wherein at least one of the trenches forms a continuous closed-loop structure and wherein the trenches are configured such that the solder is contained between the trenches on the first attach; and
wherein at least one of the trenches comprises a plurality of trench portions arranged between the inside boundary trench and the outside boundary trench, and the plurality of trench portions extend in a direction to intersect the inside boundary trench and the outside boundary trench.

* * * * *